United States Patent
Uemura et al.

(10) Patent No.: US 6,521,999 B1
(45) Date of Patent: Feb. 18, 2003

(54) TRANSPARENT ELECTRODE FILM AND GROUP III NITRIDE SEMICONDUCTOR DEVICE

(75) Inventors: Toshiya Uemura, Tsushima (JP); Shigemi Horiuchi, Nagoya (JP)

(73) Assignee: Toyoda Gosei Co. Ltd., Aichi (JP)

(*) Notice: Subject to any disclaimer, the term of this patent is extended or adjusted under 35 U.S.C. 154(b) by 268 days.

(21) Appl. No.: 09/604,678

(22) Filed: Jun. 27, 2000

(30) Foreign Application Priority Data

Jun. 28, 1999 (JP) .......................... 11-181020

(51) Int. Cl.⁷ .......................... H01L 23/48; H01L 33/00
(52) U.S. Cl. .......................... 257/745; 257/103; 257/99
(58) Field of Search .......................... 257/745, 744, 257/103, 99, 91, 81, 94, 98; 438/22

(56) References Cited

U.S. PATENT DOCUMENTS 6,281,526 B1 * 8/2001 Nitta et al. .................. 257/103
6,326,223 B1 * 12/2001 Miki et al. .................. 438/22

FOREIGN PATENT DOCUMENTS

| JP | 9-320984 | 12/1997 |
| JP | 10-209493 | 8/1998 |

* cited by examiner

*Primary Examiner*—Olik Chaudhuri
*Assistant Examiner*—(Vikki)Hoa B. Trinh
(74) *Attorney, Agent, or Firm*—McGinn & Gibb, PLLC

(57) ABSTRACT

A transparent electrode film containing gold for covering the uppermost layer of a group III nitride semiconductor device has a first layer formed on the uppermost layer and not thicker than 15 Å, and a second layer formed on the first layer and containing gold. The first layer contains a first metal having an ionization potential lower than that of gold, and the second layer further contains a second metal having an ionization potential lower than that of gold.

11 Claims, 2 Drawing Sheets

TRANSPARENT ELECTRODE FILM AND GROUP III NITRIDE SEMICONDUCTOR DEVICE

BACKGROUND OF THE INVENTION

1. Field of the Invention

The present invention relates to an improvement of a transparent electrode in a group III nitride semiconductor light-emitting device.

The present application is based on Japanese Patent Application No. Hei. 11-181020, which is incorporated herein by reference.

2. Description of the Related Art

The-configuration of a background-art transparent electrode has been described in Unexamined Japanese Patent Publication No. Hei. 9-320984. The background-art transparent electrode has a layered structure with a first layer of a first metal formed on a p-type layer as the uppermost layer of a group III nitride semiconductor light-emitting device, and a second layer of a second metal laminated on the first layer. In the configuration, the first metal (Ni: 25 Å thick in an example) has a lower ionization potential than that of the second metal (Au: 60 Å thick in the example). The reason why the first metal lower in ionization potential is formed on the p-type layer is that the first metal high in reactivity is firmly bonded to the p-type layer.

When such a transparent electrode film having a two-layered structure formed on a p-type layer is subjected to a heat treatment, metal elements for forming the respective layers diffuse each other. As a result, distributions of the metal elements are substantially inverted after the heat treatment. That is, the first metal is turned up.

The transparent electrode is coated with a protective film of silicon oxide, or the like. The protective film is formed after the aforementioned heat treatment.

The inventors of the present invention have eagerly investigated the aforementioned transparent electrode film but have been confronted by the following problem.

That is, the laminate of the first and second metals for forming the transparent electrode film was often observed peeling from the p-type layer though firm adhesion due to the first metal was expected. According to the inventors'examination, this was conceived to be for the following reason. The laminate for forming the transparent electrode film was subjected to a chemicals treating process, a cleaning process, a plasma ashing process, etc. before the laminate was subjected to the heat treatment. For example, the laminate for forming the transparent electrode film was formed by a lift-off method using a photo resist formed on the p-type layer. The laminate for forming the transparent electrode film was, however, affected by a releasant solution for releasing the photo resist. Particularly, the releasant solution had influence on the high-reactive first metal to weaken its adhesion to the p-type layer. Because such a photo resist was used also for forming an electrode pad, a releasant solution used therefor had further influence on the first metal.

Other processes such as an acetone ultrasonic cleaning process and a plasma ashing process were assumed to have influence on the first metal which was low in ion potential and, accordingly, high in reactivity.

SUMMARY OF THE INVENTION

Figure 1:
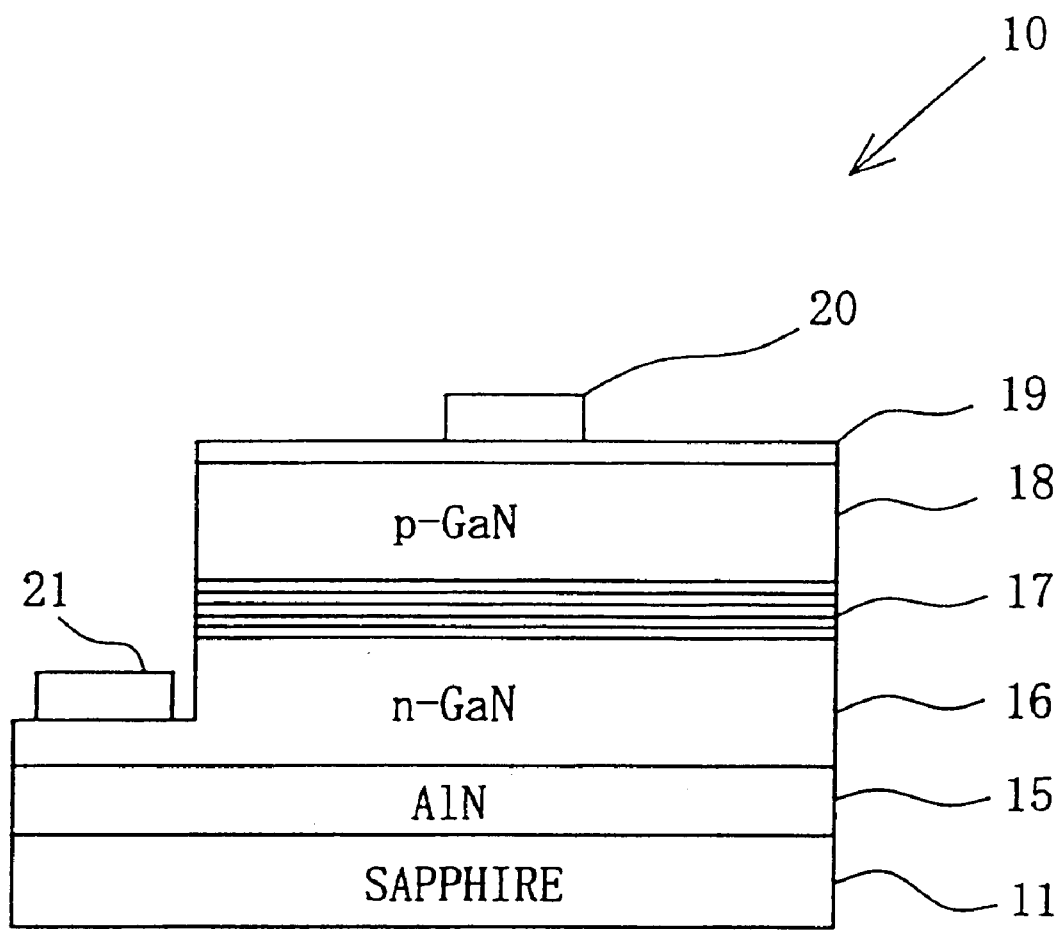
FIG. 1 shows a light-emitting diode according to an example of the present invention.

The present invention is conceived in consideration of the aforementioned problem. The configuration of the present invention is as follows.

A transparent electrode film to be provided on a p-type layer of a group III nitride semiconductor device, comprises: a first layer not thicker than 15 Å, formed on the p-type layer and made of a first metal having an ionization potential lower than that of gold or platinum; and a second layer formed on the first layer and made of gold or platinum.

In this specification, "transparent electrode film" means a precursor of a transparent electrode provided on a p-type layer of a group III nitride semiconductor device.

In the thus formed transparent electrode film laminate, the first layer of the first metal having a low ionization potential is provided as a very thin film which has a thickness approximately equal to the length of several atoms, that is, which is not thicker than 15 Å. Further, the first layer is covered with the low-reactive second layer containing gold or platinum. Hence, a resist releasant solution cannot permeate the inside of the first layer when the transparent electrode film laminate is exposed to the resist releasant solution. Accordingly, the first layer is prevented from being eroded by the resist solution, so that the adhesion of the first layer to the p-type layer can be secured.

Similarly, there is little influence on the first layer also when the transparent electrode film laminate is subjected to another process such as an acetone ultrasonic cleaning process, a plasma ashing process, or the like.

As described preliminarily, the first metal is diffused into the outer surface side of the transparent electrode by a heat treatment. Hence, the first metal improves adhesion between the transparent electrode and a protective film (silicon dioxide, or the like) applied thereonto.

If the first layer is made thin as described above, the amount of the first metal diffused into the outer surface by the heat treatment may be in short supply. Therefore, the first metal may be contained also in the second layer so that a sufficient amount of the first metal can be diffused into the outer surface side by the heat treatment. This countermeasure may be taken so that sufficient adhesion can be obtained between the transparent electrode and the protective layer.

In the above description, at least one member selected from the group consisting of nickel, cobalt, iron, copper, chromium, tantalum, vanadium, manganese, aluminum, silver, and alloys thereof can be used as the first metal which constitutes the first layer.

The thickness of the first layer is set to be not larger than 15 Å, preferably not larger than 12 Å, especially not larger than 10 Å. If the first layer is thicker than 15 Å, the resist releasant solution is assumed to permeate the inside of the first layer from side surfaces thereof.

The lower limit of the thickness of the first layer is estimated to be about 5 Å. If the first layer is thinner than 5 Å, sufficient adhesion to the semiconductor layer cannot be obtained.

The second layer mainly contains gold or platinum. Gold or platinum is preferred as a material of the electrode because it serves as ohmic contact with a p-type group III nitride semiconductor. Besides gold or platinum, a noble metal of a high ionization potential such as palladium, iridium, or the like, may be used as a single metal or as a gold or platinum alloy containing the noble metal.

Preferably, the second layer is formed to contain a second metal having a lower ionization potential than that of gold or platinum so that the second metal is diffused into the outer surface side by the heat treatment to thereby secure adhesion between the transparent electrode and the protective layer.

Any one of materials exemplified for the first metal can be used as the second metal. Preferably, the second metal is made identical to the first metal. If the two metals are different from each other, there is a possibility that the outer surface of the transparent electrode may be covered with a spotty pattern.

The second metal may be diffused into gold as a main component of the second layer or may be stratified.

The amount of the second metal to be contained in the second layer is not particularly limited so long as it is diffused into the outer surface of the light-transmissible metal sufficiently to provide suitable adhesion to the protective layer. According to the inventors' examination, the second metal, when stratified, is preferably provided so that the thickness of the second metal is set to be in a range of from 5 to 15 Å and that the total thickness of the second metal and the first layer is set to be in a range of from 12 to 30 Å, especially, in a range of from 15 to 25 Å.

The thickness of the second layer is not particularly limited so long as the electrical conductivity of the second layer acting as the transparent electrode can be secured. In an example, a laminate of a gold layer 60 Å thick and a cobalt layer 10 Å thick is used as the second layer.

The aforementioned laminate of the first and second layers is formed by a method such as evaporation on a p-type layer in a group III nitride semiconductor light-emitting device.

Group III nitride semiconductors are represented by the general formula $Al_xGa_yIn_{1-x-y}N$ ($0 \leq X \leq 1$, $0 \leq Y \leq 1$, $0 \leq X+Y \leq 1$), inclusive of so-called binary compounds such as AlN, GaN and InN, and so-called ternary compounds such as $Al_xGa_{1-x}N$, $Al_xIn_{1-x}N$ and $Ga_xIn_{1-x}N$ ($0 \leq X \leq 1$ each). In the general formula, the group III elements may be partially replaced by boron (B), thallium (Ti), etc. and the nitrogen (N) may be partially replaced by phosphorus (P), arsenic (As), antimony (Sb), bismuth (Bi), etc.

Each of the group III nitride semiconductors may contain any optional dopant. A device function portion of the light-emitting device is preferably constituted by semiconductors of the aforementioned binary or ternary group III nitride compounds.

Each of the group III nitride semiconductors may contain a dopant at option. Si, Ge, Se, Te, C, etc. can be used as n-type impurities.-Mg, Zn,-Be, Ca, Sr, Ba, etc. can be used as p-type impurities. Incidentally, it is difficult to change the group III nitride semiconductor to a p-type semiconductor of low resistance only by doping the semiconductor with such p-type impurities. The group III nitride semiconductor is preferably subjected to electron-beam irradiation, plasma irradiation or heating by means of a furnace after the semiconductor is doped with p-type impurities.

The group III nitride semiconductor may be formed by a metal organic chemical vapor deposition method (MOCVD method) or by another known method such as a molecular beam epitaxy method (MBE method), a halide vapor phase epitaxy method (HVPE method), a liquid phase epitaxy method, etc.

A pad electrode is formed on the transparent electrode film laminate by an ordinary method (see Unexamined Japanese Patent Publication No. Hei. 9-320984, Unexamined Japanese Patent Publication No. Hei. 10-209493, and so on) and then subjected to a heat treatment at a temperature in a range of from 400 to 700° C. in a gas containing at least oxygen. Incidentally, the oxygen-containing gas to be used may be constituted by at least one member selected from the group consisting of $O_2$, $O_3$, CO, $CO_2$, NO, $N_2O$, $NO_2$ and $H_2O$ or by a mixture gas of members selected from this group. Alternatively, the oxygen-containing gas may be constituted by a mixture gas of an inert gas and at least one member selected from the group consisting of $O_2$, $O_3$, CO, $CO_2$, NO, $N_2O$, $NO_2$ and $H_2O$ or by a mixture gas of an inert gas and a mixture gas of members selected from this group. In short, the oxygen-containing gas means a gas containing molecules having oxygen atoms. As a result, the first and second metals are diffused in a direction opposite to the direction of diffusion of gold to thereby form a transparent electrode having desired characteristic. Gold or platinum is diffused into the p-type layer side so that it serves as an ohmic contact between the p-type layer and the transparent electrode. The first and second metals are diffused into the outer surface side to form good adhesion between the transparent electrode and the protective film.

Features and advantages of the invention will be evident from the following detailed description of the preferred embodiments described in conjunction with the attached drawings.

DETAILED DESCRIPTION OF THE PREFERRED EMBODIMENTS

An example of the present invention will be described below.

This example shows a light-emitting diode 10 and the configuration thereof is shown in FIG. 1.

| Layer | Composition | Dopant | (Thickness) |
|---|---|---|---|
| transparent electrode film 19 | | | |
| second layer 19-2 | gold | | (30Å) |
| | cobalt | | (10Å) |
| | gold | | (30Å) |
| first layer 19-1 | cobalt | | (10Å) |
| p-type clad layer 18 | p-GaN | Mg | (0.3 μm) |
| light-emitting layer 17 | superlattice structure | | |
| quantum well layer | $In_{0.15}Ga_{0.85}N$ | | (35Å) |
| barrier layer | GaN | | (35Å) |
| the number of repeated quantum well and barrier layers: 1 to 10 | | | |
| n-type clad layer 16 | n-GaN | Si | (4 μm) |
| buffer layer 15 | AlN | | (2.3 μm) |
| substrate 11 | sapphire (face a) | | (300 μm) |

The n-type clad layer 16 may be of a double-layered structure with an n⁻ layer of a low electron density on the light-emitting layer 17 side and an n⁺ layer of a high electron density on the buffer layer 15 side.

The light-emitting layer 17 is not limited to the superlattice structure. A single or double heterostructure, a homo-junction structure, or the like, may be used as the structure of the light-emitting device.

An $Al_xIn_yGa_{1-x-y}N$ (inclusive of X=0, Y=0, x=Y=0) layer, which has a wide band gap and which is doped with an acceptor such as magnesium, or the like, may be interposed between the light-emitting layer 17 and a p-type clad layer 18. This technique is used for preventing electrons implanted into the light-emitting layer 17 from being diffused into the p-type clad layer 18.

The p-type clad layer 18 may be of a double-layered structure with a p− layer of a low hole density on the light-emitting layer 17 side and a p+ layer of a high hole density on the electrode side.

The light-emitting diode configured as described above is produced as follows.

First, the surface of a sapphire substrate is cleaned by keeping the sapphire substrate at 1000° C. for 5 minutes while circulating a hydrogen gas into a reactor of an MOCVD apparatus.

Then, the temperature of the substrate is changed to 400° C. and TMA is introduced, so that a buffer layer 15 of AlN is grown by an MOCVD method. The substrate temperature is further raised to form an n-type clad layer 16. Second group III nitride semiconductor layers 17 and 18 following the n-type clad layer 16 are formed by an ordinary method (MOCVD method). In the growth method, an ammonia gas and gases of group III metal alkyl compounds such as trimethylgallium (TMG), trimethylaluminum (TMA) and trimethylindium (TMI) are supplied onto the substrate heated to an appropriate temperature so as to be subjected to a thermal decomposition reaction so that a desired crystal is grown on the substrate.

Then, after a mask of Ti/Ni is formed, the p-type clad layer 18, the light-emitting layer (active layer) 17 and the n-type clad layer 16 are partially removed by reactive ion etching so that a portion of the n-type clad layer 16 in which an n-type electrode pad 21 is to be formed is exposed.

A transparent electrode 19 is formed by a lift-off method.

After a photo resist is applied onto the semiconductor surface uniformly, the photo resist is removed from an electrode-forming portion on the p-type clad layer 18 by photolithography so that this portion of the p-type clad layer 18 is exposed.

Figure 2:
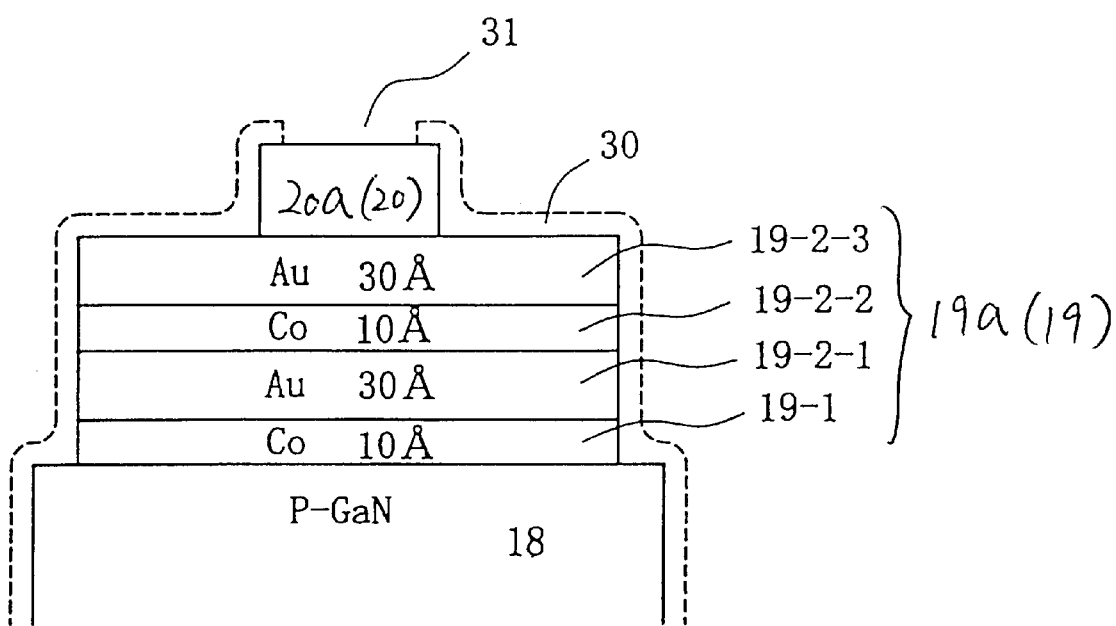
FIG. 2 is a partly enlarged view showing a transparent electrode film in the light-emitting diode.

A cobalt (Co) film 10 Å thick is formed on the exposed portion of the p-type clad layer 18 by using an evaporation apparatus, so that a first layer 19-1 is formed as shown in detail in FIG. 2.

Then, a first gold (Au) layer 19-2-1 30 Å thick is formed, as a constituent part of a second layer 19-2, on-the first layer 19-1.

Then, a-cobalt layer 19-2-2 10 Å thick is formed, as a constituent part of the second layer 19-2, on the first gold layer 19-2-1.

Then, a second gold layer 19-2-3 30 Å thick is formed, as a constituent part of the second layer 19-2, on the cobalt layer 19-2-2.

Then, after the sample is taken out from the evaporation apparatus, the photo resist is removed together with constituent materials (Co, Au) of the first and second layers 19-1 and 19-2 deposited on the photo resist so that a laminate (transparent electrode film) 19a for forming a transparent electrode with respect to the p-type clad layer 18 is obtained. In this occasion, the uppermost layer of the laminate 19a is constituted by a metal layer 19-2-3 high in ionization potential but low in reactivity whereas each of the first and second metal layers low in ionization potential is formed to be not thicker than 15 Å. Hence, the releasant solution has no influence on the laminate 19a when the photo resist is removed.

Then, after a photo resist is applied onto the laminate 19a and the semiconductor layer uniformly, the photo resist is removed from an electrode pad 20-forming portion so that a window is formed in the photo resist. Then, vanadium, gold and aluminum vapors are deposited on the laminate 19a successively. Then, the photo resist is removed so that a laminate 20a for forming a p-type electrode 20 is obtained. Also in this case, there is no influence on the laminate 19a in the same manner as described above.

A metal layer (aluminum in this example) for forming an n-type electrode pad 21 is formed in the same manner as described above (though not shown in FIG. 2).

Then, after the sample obtained as described above is put into a heating furnace, the furnace is evacuated to 1 mTorr or lower and then enclosed with $N_2$ and $O_2$ to the atmospheric pressure. In this condition, a heat treatment is carried out for a time in a range of from several seconds to 10 minutes after the temperature of the furnace is set to be in a temperature range of from 400° C. to 700° C. Incidentally, at least one member selected from the group consisting of $O_2$, $O_3$, CO, $CO_2$, NO, $N_2O$, $NO_2$ and $H_2O$, a mixture gas of members selected from this or a mixture gas of an inert gas and the foregoing gases can be used as the atmospheric gas. The pressure can be used in a range of from 1 mTorr to a value higher than the atmospheric pressure.

Then, a protective film 30 of silicon dioxide is formed on the surface of the sample except the bonding window portion 31 by evaporation. $TiO_2$, $Al_2O_3$, $Si_3N_4$, or the like, may be used, besides $SiO_2$, as the protective film so long as the protective film has light-transmissible characteristic and electrically insulating characteristic. Alternatively, the protective film may be formed by sputtering or CVD.

Experiment

An experiment will be described below.

The yield of a transparent electrode film (laminate) 19a formed on a p-type clad layer in the aforementioned manner as in the example is compared with the yield of a laminate formed as a comparative example in the following manner.

A cobalt (Co) film 20 Å thick is formed on the exposed portion of the p-type clad layer 18 by an evaporation apparatus so that a first layer is formed.

Then, a gold (Au) layer 60 Å thick is formed on the first layer. The total thickness of the cobalt and gold layers in the laminate as the comparative example is the same as that in the laminate as the example.

Incidentally, the following results show the frequency of abnormal chip patterns expressed in % with respect to about 20000 chip patterns formed on a 2-inch wafer.

| Process | Condition | Comparative Example | Example |
|---|---|---|---|
| Resist releasant solution process | 120° C.: 3 min × 5 times | 20~30% | 0% |
| Acetone ultrasonic cleaning process | 20 min × 5 times | 5~10% | 0% |
| Plasma ashing process | 150° C.: RF300W (10 min) | 10~20% | 0% |

It is apparent from the above description that the transparent electrode film in the example is little peeled from the p-type clad layer during the process of producing the light-emitting device.

The present invention is not limited to the descriptions of the mode for carrying out the invention and examples thereof at all, but includes various modifications that can be conceived by those-skilled in the art without departing from the scope of claim for a patent.

The following items will be disclosed below.

(21) A method of producing a transparent electrode of a group III nitride semiconductor light-emitting device, comprising the steps of:
  forming a first layer of a first metal on a p-type layer, the first metal having a first ionization potential;
  forming a second layer of a second metal on the first layer, the second metal having a second ionization potential higher than the first ionization potential of the first metal;
  forming a third layer of the first metal on the second layer; and
  forming a fourth layer of the second metal on the third layer.

(22) A producing method according to the paragraph (21), wherein:
  the first metal is at least one member selected from the group consisting of nickel, cobalt, iron, copper, chromium, tantalum, vanadium, manganese, aluminum, silver, and alloys thereof; and
  the second metal is gold or platinum.

(23) A producing method according to the paragraph (22), wherein: the first metal and the second metal are cobalt and gold respectively; and the first layer has a thickness in a range of from 5 to 15 Å.

(31) A transparent electrode film to be provided on a p-type layer of a group III nitride semiconductor light-emitting device, comprising:
  a first layer not thicker than 15 Å, formed on the p-type layer and containing a first metal more excellent in adhesion to the p-type layer than gold or platinum; and
  a second layer of gold or platinum formed on the first layer.

(32) A transparent electrode film according to the paragraph (31), wherein the first metal is constituted by at least one member selected from the group consisting of nickel, cobalt, iron, copper, chromium, tantalum, vanadium, manganese, aluminum, silver, and alloys thereof.

(33) A transparent electrode film according to the paragraph (31) or (32), wherein the second layer contains a second metal having a lower ionization potential than that of gold or platinum.

(34) A transparent electrode film according to the paragraph (31) or (32), wherein the second layer contains at least one layer of a second metal which is not thicker than 15 Å.

(35) A transparent electrode film according to the paragraph (33) or (34), wherein the second metal is constituted by at least one member selected from the group consisting of nickel, cobalt, iron, copper, chromium, tantalum, vanadium, manganese, aluminum, silver, and alloys thereof.

(36) A transparent electrode film according to any one of the paragraphs (33) through (35), wherein the first metal is identical with the the second metal.

(37) A transparent electrode film according to any one of the paragraphs (33)-through (36), wherein the second metal contained in the second layer has adhesiveness sufficient to bond the transparent electrode film to a-protective film applied onto the transparent electrode film.

(38) A method of producing a group III nitride compound light-emitting semiconductor, comprising the step of forming a transparent electrode film as defined in any one of the paragraphs (31) through (37).

(39) A-transparent electrode comprising a transparent electrode film which is defined in any one of the paragraphs (31) through (37) and subjected to a heat treatment in a gas containing at least oxygen.

(40) A transparent electrode according to the paragraph (39), wherein the oxygen-containing gas to be used in the heat treatment is constituted by at least one member selected from the group consisting of $O_2$, $O_3$, CO, $CO_2$, NO, $N_2O$, $NO_2$ and $H_2O$, by a mixture gas of members selected from the group or by a mixture gas of an insert gas and these gases.

(41) A group III nitride semiconductor light-emitting device comprising a transparent electrode as defined in the paragraph (39) or (40).

(50) A transparent electrode film containing gold for covering the uppermost layer of a group III nitride semiconductor device, comprising:
  a first layer not thicker than 15 Å, formed on the uppermost layer and containing a first metal having an ionization potential lower than that of the gold; and
  a second layer containing gold, formed on the first layer and further containing a second metal having an ionization potential lower than that of the gold.

(51) A transparent electrode film containing gold for covering the uppermost layer of a group III nitride semiconductor light-emitting device, comprising:
  a first layer not thicker than 15 Å, formed on the uppermost layer and containing a first metal more excellent in adhesion to the uppermost layer than the gold; and
  a second layer containing gold, formed on the first layer and further containing a second metal more excellent in adhesion to a protective layer-than the gold.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A transparent electrode film to be provided on a p-type layer of a group III nitride semiconductor device, comprising:
  a first layer not thicker than 15 Å, formed on said p-type layer and comprising a first metal having an ionization potential lower than that of gold or platinum; and
  a second layer formed on said first layer and comprising gold or platinum.

2. A transparent electrode film according to claim 1, wherein said first metal is constituted by at least one member selected from the group consisting of nickel, cobalt, iron, copper, chromium, tantalum, vanadium, manganese, aluminum, silver, and alloys thereof.

3. A transparent electrode film according to claim 1, wherein said second layer contains a second metal having a lower ionization potential than that of gold or platinum.

4. A transparent electrode film according to claim 1, wherein said second layer contains at least one layer of a second metal which is not thicker than 15 Å.

5. A transparent electrode film according to claim 3, wherein said second metal is constituted by at least one member selected from the group consisting of nickel, cobalt, iron, copper, chromium, tantalum, vanadium, manganese, aluminum, silver, and alloys thereof.

6. A transparent electrode film according to claim 3, wherein said first metal is identical with said second metal.

7. A transparent electrode film according to claim 3, wherein said second metal contained in said second layer has adhesiveness sufficient to bond said transparent electrode film to a protective film applied onto said transparent electrode film.

8. A method of producing a group III nitride compound light-emitting semiconductor, comprising a step of forming a transparent electrode film as defined in any one of claims 1 through 7.

9. A transparent electrode comprising a transparent electrode film which is defined in any one of claims 1 through 7 and subjected to a heat treatment in a gas containing at least oxygen.

10. A transparent electrode according to claim 9, wherein said oxygen-containing gas to be used in said heat treatment is constituted by at least one member selected from the group consisting of $O_2$, $O_3$, CO, $CO_2$, NO, $N_2O$, $NO_2$ and $H_2O$, by a mixture gas of members selected from said group or by a mixture gas of an insert gas and these gases.

11. A group III nitride semiconductor light-emitting device comprising a transparent electrode as defined in claim 9.

* * * * *